United States Patent
Ku et al.

(10) Patent No.: US 9,275,700 B2
(45) Date of Patent: Mar. 1, 2016

(54) SEMICONDUCTOR DEVICE

(71) Applicant: SK hynix Inc., Gyeonggi-do (KR)

(72) Inventors: Kie-Bong Ku, Gyeonggi-do (KR);
Hye-Young Lee, Gyeonggi-do (KR);
Sung-Hwa Ok, Gyeonggi-do (KR);
Se-Jin Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 14/106,794

(22) Filed: Dec. 15, 2013

(65) Prior Publication Data

US 2015/0071009 A1    Mar. 12, 2015

(30) Foreign Application Priority Data

Sep. 9, 2013   (KR) .................. 10-2013-0107847

(51) Int. Cl.
*G11C 7/10*       (2006.01)
*G11C 7/22*       (2006.01)

(52) U.S. Cl.
CPC ............ *G11C 7/1087* (2013.01); *G11C 7/1006* (2013.01); *G11C 7/227* (2013.01)

(58) Field of Classification Search
None
See application file for complete search history.

(56) References Cited

U.S. PATENT DOCUMENTS

2010/0118618 A1*  5/2010  Kwak ................. G11C 7/1006
                                                          365/189.05

FOREIGN PATENT DOCUMENTS

KR   1020120046449   5/2012
KR   1020120068217   6/2012

* cited by examiner

*Primary Examiner* — James G Norman
(74) *Attorney, Agent, or Firm* — IP & T Group LLP (57) ABSTRACT

A semiconductor device includes a data bus inversion (DBI) decision unit suitable for deciding whether a DBI operation mode is performed, based on a read data, and generating a DBI decision signal corresponding to a result of the decision; an output control unit suitable for generating an arrangement control signal in which a delay amount of time for the decision is reflected, in a DBI operation mode; a data synchronization unit suitable for synchronizing the read data with the arrangement control signal and output the synchronized read data and inverted signals of the synchronized read data, in the DBI operation mode; and a data output unit suitable for selectively outputting the synchronized read data and the inverted signals of the synchronized read data, to an external in response to the DBI decision signal, the arrangement control signal and an output control signal, in the DBI operation mode.

12 Claims, 3 Drawing Sheets

SEMICONDUCTOR DEVICE

CROSS-REFERENCE TO RELATED APPLICATIONS

The present application claims priority of Korean Patent Application No. 10-2013-0107847, filed on Sep. 9, 2013, which is incorporated herein by reference in its entirety.

BACKGROUND

1. Field

Exemplary embodiments of the present invention relate to a semiconductor design technology, and more particularly, to a semiconductor device for supporting a data bus inversion operation mode.

2. Description of the Related Art

Semiconductor devices including a dynamic random access memory (DRAM) may support a data bus inversion (DBI) operation mode to reduce current consumption generated in data transmission.

For example, in the DBI operation mode, a semiconductor device inverts and transmits a data when the number of bits with a logic low level is greater than that of bits with a logic high level in the data. This is because an amount of current consumption for transmission of a bit with a logic low level is greater than that of a bit with a logic high level when transmission lines for the data transmission are terminated to a source voltage VDDQ.

The data inversion makes the number of bits with a logic low level to be less than a half of the number of total bits of the data when the data is transmitted through the transmission lines.

The semiconductor device may be desirable to delay command and data by a delay time caused in determining the DBI. Such delaying of the command and data guarantees operation reliability of the semiconductor device by compensating for data transmission timing in the DBI operation mode.

SUMMARY

Various embodiments of the present invention are directed to a semiconductor device that may minimize a circuit area and current consumption for supporting a DBI operation mode.

In accordance with an embodiment of the present invention, a semiconductor device may include: a data bus inversion (DBI) decision unit suitable for deciding whether a DBI operation mode is performed, based on a read data, and generating a DBI decision signal corresponding to a result of the decision; an output control unit suitable for generating an arrangement control signal in which a delay amount of time for the decision is reflected, in a DBI operation mode; a data synchronization unit suitable for synchronizing the read data with the arrangement control signal and output the synchronized read data and inverted signals of the synchronized read data, in the DBI operation mode; and a data output unit suitable for selectively outputting the synchronized read data and the inverted signals of the synchronized read data, to an external in response to the DBI decision signal, the arrangement control signal and an output control signal, in the DBI operation mode.

In accordance with an embodiment of the present invention, a semiconductor device may include: a command control unit suitable for generating a first arrangement control signal and an output control signal based on a read command; a data bus inversion (DBI) decision unit suitable for determining whether a DBI operation mode is performed, based on a first read data and generating a DBI decision signal corresponding to a result of the decision; a DBI replica delay unit suitable for generating a second arrangement control signal by delaying the first arrangement control signal by an amount of time for the decision; a command selection unit suitable for selecting one of the first arrangement control signal and the second arrangement control signal in response to a DBI mode signal, and outputting the selected one as a third arrangement control signal; a data synchronization unit suitable for synchronizing the first read data with the second arrangement control signal and outputting the synchronized data as a second read data and an inverted second read data in response to the DBI mode signal; a data selection unit suitable for selectively outputting one of the first read data, the second read data, and the inverted second read data in response to the DBI decision signal and the DBI mode signal; and a data arrangement unit suitable for arranging the selected read data output from the data selection unit in response to the third arrangement control signal, and outputting the arranged read data to an external in response to the output control signal.

In accordance with an embodiment of the present invention, a semiconductor device may include a data bus inversion (DBI) decision unit suitable for determining whether or not to inverse bits of a data to be transmitted, based on a plurality of first data; an output control unit suitable for outputting one of a first arrangement control signal and a second arrangement control signal, which is generated by delaying the first arrangement control signal with the amount of time for deciding whether or not to inverse bits of the data to be transmitted, as a third arrangement control signal in response to a DBI mode signal; a data synchronization unit suitable for synchronizing the plurality of first data with a second arrangement control signal and output the synchronized data in response to the DBI mode signal; a data selection unit suitable for outputting one of the plurality of first data, a plurality of second data output from the data synchronization unit and a plurality of third data inverted from the plurality of second data in response to a DBI decision signal output from the DBI decision unit; and a data arrangement unit suitable for arranging a plurality of fourth data output from the data selection unit in response to the third arrangement control signal and outputting the arranged plurality of fourth data to an external in response to an output control signal.

In accordance with the embodiments of the present invention, a circuit area for a DBI operation mode may be minimized and current consumption for the DBI operation mode may also be minimized.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
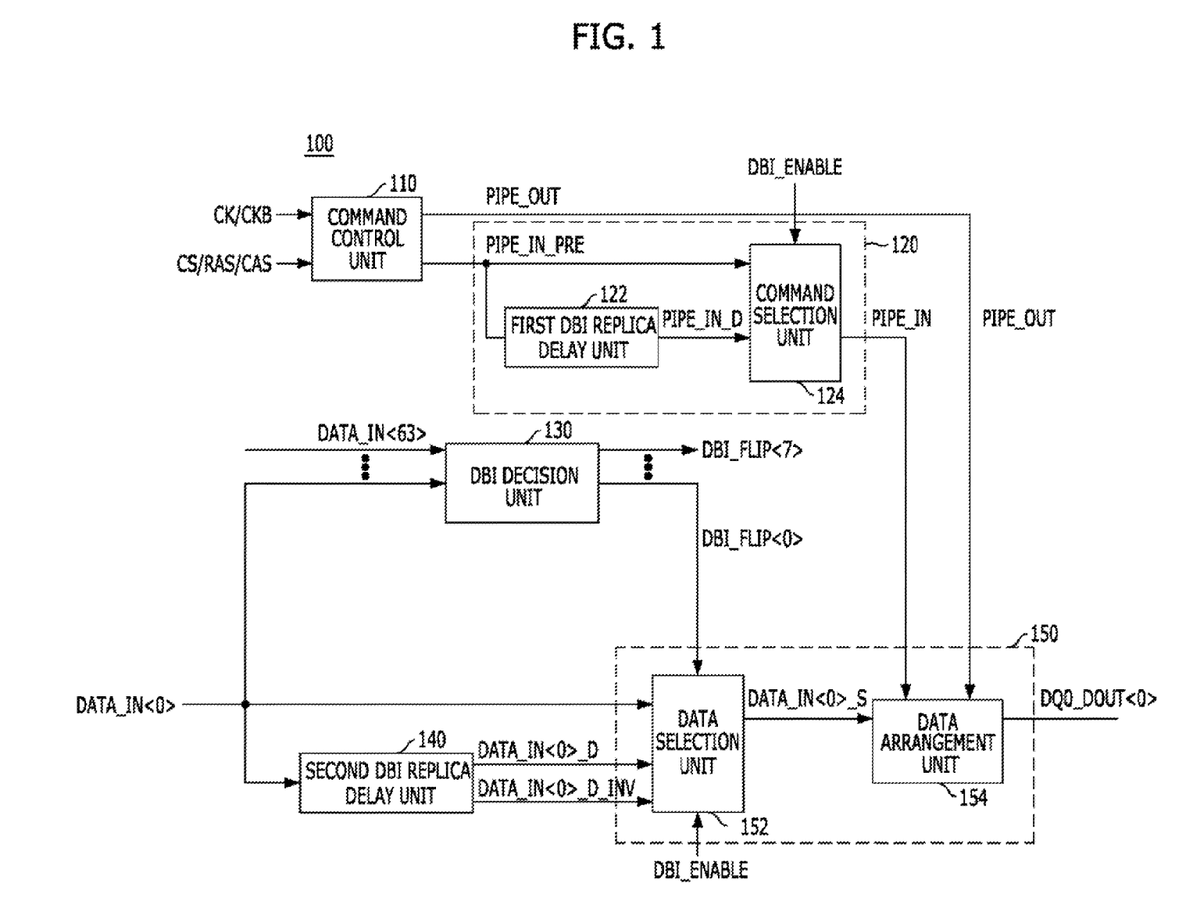
FIG. 1 is a block diagram illustrating a semiconductor device according to a comparative example.

FIG. 1 is a block diagram illustrating a semiconductor device according to a comparative example.

FIG. 1 shows as an example the semiconductor device where data is sequentially output 8 times through one data pad DQ (i.e., a burst length of data is 8) in X8 mode in which 8 bits of data is simultaneously output input/output through 8 data pads DQ0 to DQ7 (not illustrated). In the semiconductor device with the burst length of 8, 8 times (i.e., 8 bits) per a data pad are output and totally 64 bits of data are output from a cell array through 8 data pads DQ0 to DQ7 in response to a read command.

Referring to FIG. 1, the semiconductor device 100 includes a command control unit 110, an output control unit 120, a DBI decision unit 130, a second DBI replica delay unit 140, and a data output unit 150.

FIG. 1 shows the second DBI replica delay unit 140 and the data output unit 150 corresponding to a first read data DATA_IN<0> of one bit output through a pad DQ0 as an example.

The command control unit 110 generates a first arrangement control signal PIPE_IN_PRE and an output control signal PIPE_OUT based on commands including a chip select signal (CS), a row address strobe signal (RAS), and a column address strobe signal (CAS), which are related to a read command (not illustrated), and clocks CK and CKB. Here, the clock CKB may be a complementary clock of the clock CK. For example, the command control unit 110 generates the read command based on the commands CS, RAS, and CAS and generates the first arrangement control signal PIPE_IN_PRE and the output control signal PIPE_OUT at predetermined point in time based on the read command.

The output control unit 120 includes a first DBI replica delay unit 122 and a command selection unit 124.

The first DBI replica delay unit 122 generates a second arrangement control signal PIPE_IN_D by delaying the first arrangement control signal PIPE_IN_PRE by an amount of time (hereinafter, referred to as "DBI decision time") for the DBI decision unit 130 to decide whether or not to invert bits of a data to be transmitted.

The command selection unit 124 outputs one of the first arrangement control signal PIPE_IN_PRE and the second arrangement control signal PIPE_IN_D as a third arrangement control signal PIPE_IN in response to a DBI mode signal DBI_ENABLE. For example, the command selection unit 124 includes a multiplexer.

The DBI decision unit 130 determines, based on first to 64th read data DATA_IN<0:63>, whether or not to invert bits of a data to be transmitted and generates first to eighth DBI decision signals DBI_FLIP<0:7> corresponding to a result of the decision.

The second DBI replica delay unit 140 outputs a first delay data DATA_IN<0>_D and an inverted first delay data DATA_IN<0>_D_INV, which is an inverted signal of the first delay data DATA_IN<0>_D, by delaying the first read data DATA_IN<0> by the amount of the DBI decision time.

The data output unit 150 includes a data selection unit 152 and a data arrangement unit 154.

The data selection unit 152 outputs a first selection signal DATA_IN<0>_S as one of the first read data DATA_IN<0>, the first delay data DATA_IN<0>_D, and an inverted first delay data DATA_IN<0>_D_INV, which is an inverted signal of the first delay data DATA_IN<0>_D, in response to the DBI mode signal DBI_ENABLE and the DBI decision signal DBI_FLIP<0>. For reference, although not illustrated in FIG. 1, the second DBI replica delay unit 140 and the data output unit 150 are provided for the respective first to 64th read data DATA_IN<0:63>. Further, the first to eighth read data DATA_IN<0:7> are assigned to the first DBI decision signal DBI_FLIP<0>.

The data arrangement unit 154 arranges the first selection signal DATA_IN<0>_S in response to the third arrangement control signal PIPE_IN and outputs a first output data DQ0_DOUT<0> as the arranged first selection signal to an external (e.g., a memory controller) through the data pad DQ0 (not illustrated) in response to the output control signal PIPE_OUT.

The semiconductor device 100 enters the DBI operation mode as the DBI mode signal DBI_ENABLE is activated.

Here, the semiconductor device 100 performs read operation in response to the commands CS, RAS, and CAS and the clocks CK and CKB.

During the read operation, the command control unit 110 generates the first arrangement control signal PIPE_IN_PRE and the output control signal PIPE_OUT in response to the commands CS, RAS, and CAS and the clocks CK and CKB.

The first DBI replica delay unit 122 generates the second arrangement control signal PIPE_IN_D by delaying the first arrangement control signal PIPE_IN_PRE by the amount of the DBI decision time.

The command selection unit 124 selects and outputs the second arrangement control signal PIPE_IN_D of the first arrangement control signal PIPE_IN_PRE and the second arrangement control signal PIPE_IN_D as the third arrangement control signal PIPE_IN to the data arrangement unit 154. The second arrangement control signal PIPE_IN_D is selected to compensate for the DBI decision time in the DBI operation mode.

During the read operation, the first to 64th read data DATA_IN<0:63> are output from the cell array (not illustrated).

The DBI decision unit 130 decides, based on the first to 64th read data DATA_IN<0:63>, whether or not to invert bits of a data to be transmitted and generates the first to eighth DBI decision signals DBI_FLIP<0:7> corresponding to a result of the decision.

In detail, the DBI decision unit 130 decides a majority of the first to 64th read data DATA_IN<0:63> in terms of a data polarity, decides activation/deactivation of the DBI decision signals DBI_FLIP<0:7> according to the decision result of the majority and outputs the first to eighth DBI decision signals DBI_FLIP<0:7>.

For example, in case of the X8 mode, the first to 64th read data DATA_IN<0:63> are output from the cell array. The DBI decision unit 130 decides a majority of each 8 bits of the first to 64th read data DATA_IN<0:63> and generates the first to eighth DBI decision signals DBI_FLIP<0:7>.

8-bit data of the first to 64th read data DATA_IN<0:63> are output at a first burst through the 8 data pads DQ0 to DQ7. The first DBI decision signal DBI_FLIP<0> is activated when a number of bits with a first level (e.g., a logic low level) exceed 4 in the 8-bit data (e.g., DATA_IN<0:7>) at the first burst. The first DBI decision signal DBI_FLIP<0> is deactivated when a number of bits with the first level are below 4 in the 8-bit data at the first burst.

Likewise, the second to eighth DBI decision signals DBI_FLIP<1:7> are activated or deactivated according to a second to eighth bursts, respectively.

The second DBI replica delay unit 140 outputs the first delay data DATA_IN<0>_D and the inverted first delay data DATA_IN<0>_D_INV by delaying the first read data DATA_IN<0> by the amount of the DBI decision time.

The data selection unit 152 selects the first delay data DATA_IN<0>_D or the inverted first delay data DATA_IN<0>_D_INV among the first read data DATA_IN<0>, the first delay data DATA_IN<0>_D in response to the first DBI decision signal DBI_FLIP<0> and the DBI mode signal DBI_ENABLE, and the inverted first delay data DATA_IN<0>_D_INV, and output the selected one as the first selection signal DATA_IN<0>_S to the data arrangement unit 154. The data selection unit 152 selects and outputs the inverted first delay data DATA_IN<0>_D_INV as the first selection signal DATA_IN<0>_S when the first DBI decision signal DBI_FLIP<0> is activated. The data selection unit 152 selects and outputs the first delay data DATA_IN<0>_D as the first selection signal DATA_IN<0>_S to the data arrangement unit 154 when the first DBI decision signal DBI_FLIP<0> is deactivated. The data selection unit 152 selects and outputs the first delay data DATA_IN<0>_D or the inverted first delay data DATA_IN<0>_D_INV as the first selection signal DATA_IN<0>_S to compensate for the DBI decision time for the DBI decision unit 130.

The data arrangement unit 154 arranges the first selection signal DATA_IN<0>_S output from the data selection unit 152 in response to the third arrangement control signal PIPE_IN and outputs the arranged first selection signal DATA_IN<0>_S as the first output data DQ0_DOUT<0> to the external through the data pad DQ0 (not illustrated) in response to the output control signal PIPE_OUT.

Meanwhile, the semiconductor device 100 exits from the DBI operation mode as the DBI mode signal DBI_ENABLE is deactivated.

Here, the semiconductor device 100 performs read operation in response to the commands CS, RAS, and CAS and the clocks CK and CKB.

During the read operation, the command control unit 110 generates the first arrangement control signal PIPE_IN_PRE and the output control signal PIPE_OUT in response to the commands CS, RAS, and CAS and the clocks CK and CKB.

The command selection unit 124 selects and outputs the first arrangement control signal PIPE_IN_PRE of the first arrangement control signal PIPE_IN_PRE and the second arrangement control signal PIPE_IN_D as the third arrangement control signal PIPE_IN to the data arrangement unit 154 in response to the DBI mode signal DBI_ENABLE.

During the read operation, the first to 64th read data DATA_IN<0:63> are output from the cell array (not illustrated).

The data selection unit 152 selects the first read data DATA_IN<0> among the first read data DATA_IN<0>, the first delay data DATA_IN<0>_D, and the inverted first delay data DATA_IN<0>_D_INV in response to the DBI mode signal DBI_ENABLE, and output the first read data DATA_IN<0> as the first selection signal DATA_IN<0>_S to the data arrangement unit 154.

The data arrangement unit 154 arranges the first selection signal DATA_IN<0>_S output from the data selection unit 152 in response to the third arrangement control signal PIPE_IN and outputs the arranged first selection signal DATA_IN<0>_S as the first output data DQ0_DOUT<0> to the external through the data pad DQ0 (not illustrated) in response to the output control signal PIPE_OUT.

Figure 2:
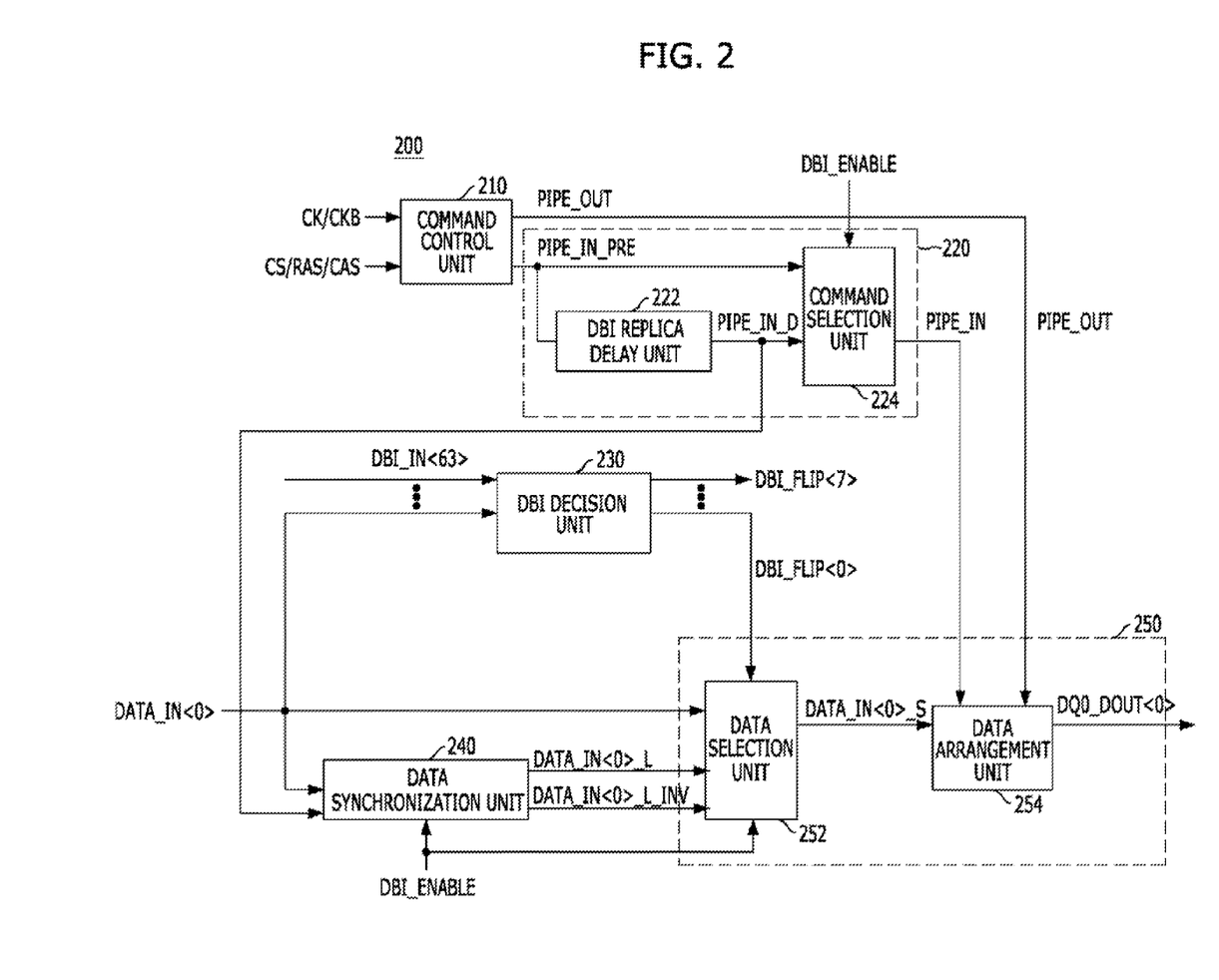
FIG. 2 is a block diagram illustrating a semiconductor device in accordance with an embodiment of the present invention.

FIG. 2 is a block diagram illustrating a semiconductor device in accordance with an embodiment of the present invention.

FIG. 2 shows as an example the semiconductor device where 8 data are output through one data pad DQ (i.e., a burst length of 8) in X8 mode, in which data are input/output through 8 data pads DQ0 to DQ7 (not illustrated). In the semiconductor device with the burst length of 8, 8 data per a pad may be output and totally 64 data may be output from a cell array through 8 data pads DQ0 to DQ7.

Referring to FIG. 2, the semiconductor device 200 may include a command control unit 210, an output control unit 220, a DBI decision unit 230, a data synchronization unit 240, and a data output unit 250.

FIG. 2 shows the data synchronization unit 240 and the data output unit 250 corresponding to a first read data DATA_IN<0> of one bit output through a pad DQ0 as an example.

The command control unit 210 may generate a first arrangement control signal (or a pre-arrangement control signal) PIPE_IN_PRE and an output control signal PIPE_OUT based on commands including a chip select signal (CS), a row address strobe signal (RAS), and a column address strobe signal (CAS), which are related to a read command (not illustrated), and clocks CK and CKB. Here, the clock CKB may be a complementary clock of the clock CK. For example, the command control unit 210 may generate a read command based in the commands CS, RAS, and CAS and generate the first arrangement control signal PIPE_IN_PRE and the output control signal PIPE_OUT at a predetermined point in time based on the read command.

The output control unit 220 may include a DBI replica delay unit 222 and a command selection unit 224.

The DBI replica delay unit 222 may include a replica circuit that may generate a second arrangement control signal PIPE_IN_D by delaying the first arrangement control signal PIPE_IN_PRE by an amount of time (i.e., DBI decision time) for the DBI decision unit 230 to decide whether or not to invert bits of a data to be transmitted.

The command selection unit 224 may output one of the first arrangement control signal PIPE_IN_PRE and the second arrangement control signal PIPE_IN_D as a third arrangement control signal PIPE_IN in response to a DBI mode signal DBI_ENABLE. The command selection unit 124 may be implemented by using a multiplexer.

The DBI decision unit 230 may decide, based on first to 64th read data DATA_IN<0:63>, whether or not to invert bits of a data to be transmitted and generate first to eighth DBI decision signals DBI_FLIP<0:7> corresponding to a result of the decision.

The data synchronization unit 240 may synchronize the first read data DATA_IN<0> with the second arrangement control signal PIPE_IN_D, in response to the DBI mode signal DBI_ENABLE and output the synchronized first read data DATA_IN<0> as a first latch data DATA_IN<0>_L.

The data output unit 250 may output a first output data DQ0_DOUT<0> as one of the first read data DATA_IN<0>, the first latch data DATA_IN<0>_L and an inverted first latch data DATA_IN<0>_L_INV, to the external in response to the DBI mode signal DBI_ENABLE, the first DBI decision signal DBI_FLIP<0>, the third arrangement control signal PIPE_IN and the output control signal PIPE_OUT.

The data output unit 250 may include a data selection unit 252 and a data arrangement unit 254.

The data selection unit 252 may output as the first selection signal DATA_IN<0>_S one of the first read data DATA_IN<0>, the first latch data DATA_IN<0>_L, and the inverted first latch data DATA_IN<0>_L_INV in response to the DBI mode signal DBI_ENABLE and the first DBI decision signal DBI_FLIP<0>. For reference, although not illustrated in FIG. 2, the second DBI replica delay unit 240 and the data output unit 250 may be provided for the respective first to 64th read data DATA_IN<0:63>. Further, the first to eighth read data DATA_IN<0:7> may be assigned to the first DBI decision signal DBI_FLIP<0>.

The data arrangement unit 254 may arrange the first selection signal DATA_IN<0>_S in response to the third arrangement control signal PIPE_IN and output the arranged first selection signal DATA_IN<0>_S, as a first output data DQ0_DOUT<0> to the external through the data pad DQ0 (not illustrated), in response to the output control signal PIPE_OUT.

For example, the data arrangement unit 254 may include a pipe register. In this case, the third arrangement control signal PIPE_IN may be a pipe input control signal and the output control signal PIPE_OUT may be a pipe output control signal.

Figure 3:
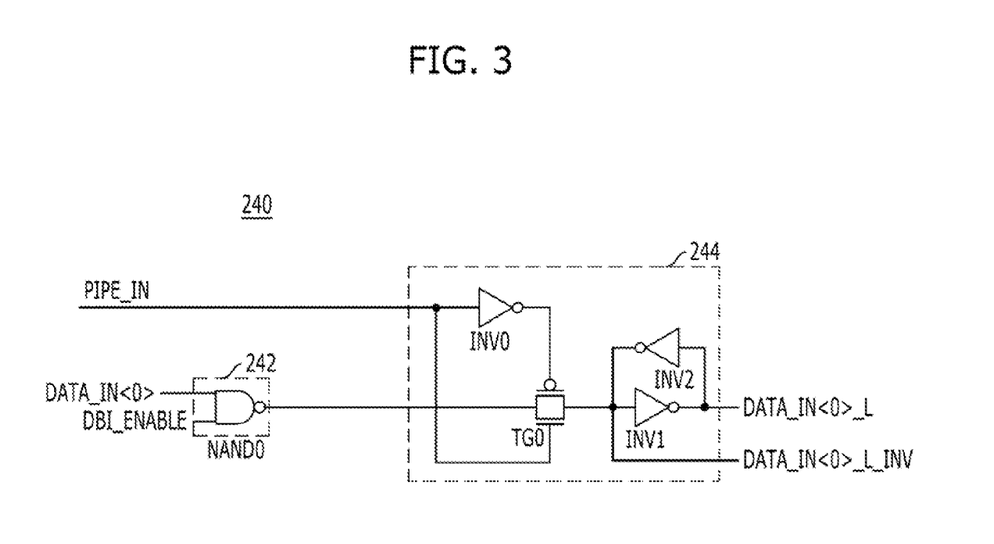
FIG. 3 is a detailed diagram of a data synchronization unit shown in FIG. 2.

FIG. 3 is a detailed diagram of the data synchronization unit 240 shown in FIG. 2.

Referring to FIG. 3, the data synchronization unit 240 may include an input unit 242 and a data latch unit 244.

The input unit 242 may selectively block the first read data DATA_IN<0> in response to the DBI mode signal DBI_ENABLE. For example, the input unit 242 may include a NAND gate receiving the DBI mode signal DBI_ENABLE and the first read data DATA_IN<0>.

The data latch unit 244 may synchronize the output signal of the input unit 242 with the second arrangement control signal PIPE_IN_D and output the synchronized signal as the first latch data DATA_IN<0>_L.

For example, as shown in FIG. 3, the data latch unit 244 may include a first inverter INV0, a transmission gate TG0, and an inverter latch including two inverters INV1 and INV2. The first inverter INV0 may invert the second arrangement control signal PIPE_IN_D. The transmission gate TG0 may transfer the output signal of the input unit 242 in response to the second arrangement control signal PIPE_IN_D and the output signal of the first inverter INV0. The inverter latch may latch the output signal of the transmission gate TG0 (i.e., the inverted first latch data DATA_IN<0>_L_INV) as the first latch data DATA_IN<0>_L. Although, in FIG. 3, the inverted first latch data DATA_IN<0>_L_INV is output from the transmission gate TG0, however, the inverted first latch data DATA_IN<0>_L_INV may be generated by inverting the first latch data DATA_IN<0>_L through an inverter inserted to an output terminal of the inverter latch.

Figure 4:
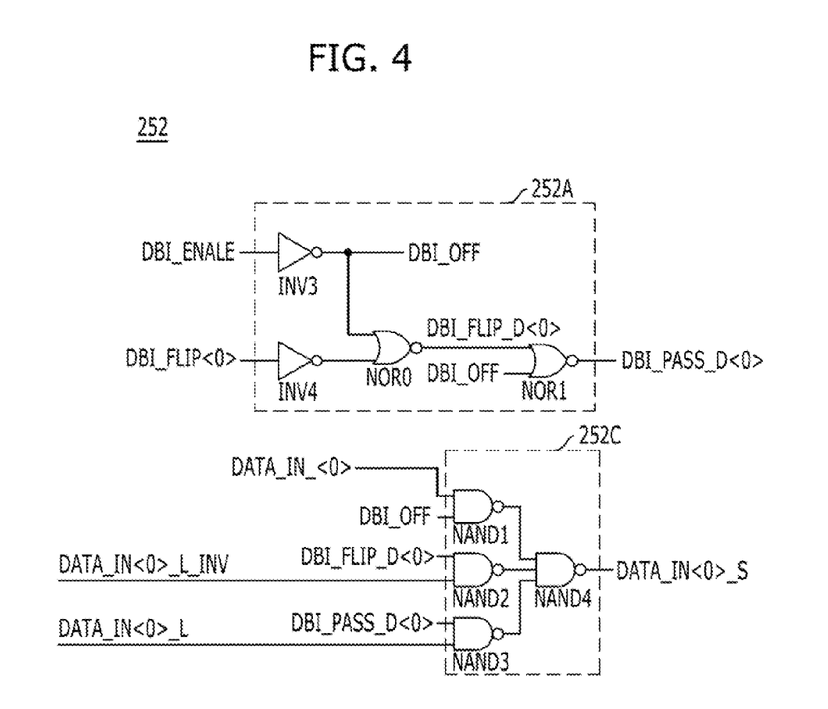
FIG. 4 is a detailed diagram of a data selection unit shown in FIG. 2.

FIG. 4 is a detailed diagram of the data selection unit 252 shown in FIG. 2.

Referring to FIG. 4, the data arrangement unit 254 may include a selection control unit 252A and a data selection unit 252C.

The selection control unit 252A may include a fourth inverter INV3, a fifth inverter INV4, a first NOR gate NOR0, and a second NOR gate NOR1. The fourth inverter INV3 may invert the DBI mode signal DBI_ENABLE and generate a first selection control signal DBI_OFF. The fifth inverter INV4 may invert the first DBI decision signal DBI_FLIP<0>.

The first NOR gate NOR0 may perform a NOR operation on the output signal of the fifth inverter INV4 and the first selection control signal DBI_OFF and output a second selection control signal DBI_FLIP_D<0>. The second NOR gate NOR1 may perform a NOR operation to the first selection control signal DBI_OFF and the second selection control signal DBI_FLIP_D<0> and generate a third selection control signal DBI_PASS_D<0>.

The data selection unit 252C may include a second NAND gate NAND1, a third NAND gate NAND2, a fourth NAND gate NAND3, and a fifth NAND gate NAND4. The second NAND gate NAND1 may perform an NAND operation on the first read data DATA_IN<0> and the first selection control signal DBI_OFF. The third NAND gate NAND2 may perform an NAND operation on the inverted first latch data DATA_IN<0>_L_INV and the second selection control signal DBI_FLIP<0>_D. The fourth NAND gate NAND3 may perform an NAND operation on the first latch data DATA_IN<0>_L and the third selection control signal DBI_PASS<0>_D. The fifth NAND gate NAND4 may perform an NAND operation on the output signals of the second to fourth NAND gates NAND1, NAND2, and NAND3, and output the first selection signal DATA_IN<0>_S.

The semiconductor device 200 may enter the DBI operation mode as the DBI mode signal DBI_ENABLE is activated.

Here, the semiconductor device 200 may perform read operation in response to the commands CS, RAS, and CAS and the clocks CK and CKB.

During the read operation, the command control unit 210 may generate the first arrangement control signal PIPE_IN_PRE and the output control signal PIPE_OUT in response to the commands CS, RAS, and CAS and the clocks CK and CKB.

The DBI replica delay unit 222 may generate the second arrangement control signal PIPE_IN_D by delaying the first arrangement control signal PIPE_IN_PRE by the amount of the DBI decision time.

The command selection unit 224 may select and output the second arrangement control signal PIPE_IN_D of the first arrangement control signal PIPE_IN_PRE and the second arrangement control signal PIPE_IN_D as the third arrangement control signal PIPE_IN to the data arrangement unit 254. The second arrangement control signal PIPE_IN_D may be selected to compensate for the DBI decision time in the DBI operation mode.

During the read operation, the first to 64th read data DATA_IN<0:63> may be output from the cell array (not illustrated).

The DBI decision unit 230 may decide, based on the first to 64th read data DATA_IN<0:63>, whether or not to invert bits of a data to be transmitted and generate the first to eighth DBI decision signals DBI_FLIP<0:7> corresponding to a result of the decision.

In detail, the DBI decision unit 230 may decide a majority of the first to 64th read data DATA_IN<0:63> in terms of a data polarity, decide activation/deactivation of the DBI decision signals DBI_FLIP<0:7> according to the decision result of the majority and output the first to eighth DBI decision signals DBI_FLIP<0:7>.

For example, in case of the X8 mode, the first to 64th read data DATA_IN<0:63> may be output from the cell array. The DBI decision unit 230 may decide a majority of each 8 bits of the first to 64th read data DATA_IN<0:63> and generate 8 bits of the first to eighth DBI decision signals DBI_FLIP<0:7>. Further, the DBI decision unit 230 may decide a majority of each 8 bits (e.g., count data having a logic low level) of the first to 64th read data DATA_IN<0:63> and generate the first to eighth DBI decision signals DBI_FLIP<0:7>.

The data synchronization unit 240 may perform an operation as follows to delay the first read data DATA_IN<0> of the first to 64th read data DATA_IN<0:63> by the amount of the DBI decision time.

The input unit 242 may block the first read data DATA_IN<0> when the DBI mode signal DBI_ENABLE is deactivated, and may invert the first read data DATA_IN<0> when the DBI mode signal DBI_ENABLE is activated.

The data latch unit 244 may synchronize the output signal of the data latch unit 244 with the second arrangement control signal PIPE_IN_D and output the synchronized signal as the first latch data DATA_IN<0>_L. In another point of view, the data latch unit 244 may latch the output signal of the data latch unit 244 in response to the second arrangement control signal PIPE_IN_D and output the latched signal as the first latch data DATA_IN<0>_L.

The data selection unit 252 may select one of the first read data DATA_IN<0>, the first latch data DATA_IN<0>_L and the inverted first latch data DATA_IN<0>_L_INV and output the selected one as the first selection signal DATA_IN<0>_S to the data arrangement unit 254, in response to the first DBI decision signal DBI_FLIP<0> and the DBI mode signal DBI_ENABLE.

The selection control unit 252A may generate the first selection control signal DBI_OFF by inverting the DBI mode signal DBI_ENABLE. When the first DBI decision signal DBI_FLIP<0> is activated (i.e., the first selection control signal DBI_OFF is deactivated), the selection control unit 252A may activate the second selection control signal DBI_FLIP<0>_D. When the first DBI decision signal DBI_FLIP<0> is deactivated, the selection control unit 252A may activate the third selection control signal DBI_PASS<0>_D.

The data selection unit 252C may receive the first read data DATA_IN<0>, the inverted first latch data DATA_IN<0>_L_INV, and the first latch data DATA_IN<0>_L, and output one of them as the first selection signal DATA_IN<0>_S in response to the first selection control signal DBI_OFF, the second selection control signal DBI_FLIP_D<0>, and the third selection control signal DBI_PASS_D<0>.

For example, the data selection unit 252C may output the inverted first latch data DATA_IN<0>_L_INV as the first selection signal DATA_IN<0>_S when the second selection control signal DBI_FLIP_D<0> is activated and the first selection control signal DBI_OFF and the third selection control signal DBI_PASS_D<0> are deactivated. Further, the data selection unit 252C may output the first latch data DATA_IN<0>_L as the first selection signal DATA_IN<0>_S when the third selection control signal DBI_PASS_D<0> is activated and the first selection control signal DBI_OFF and the second selection control signal DBI_FLIP_D<0> are deactivated. Further, the data selection unit 252C may output the first read data DATA_IN<0> as the first selection signal DATA_IN<0>_S when the first selection control signal DBI_OFF is activated and the second selection control signal DBI_FLIP_D<0> and the third selection control signal DBI_PASS_D<0> are deactivated. For reference, in the DBI operation mode, the first selection control signal DBI_OFF is deactivated, and thus the data selection unit 252C may not output the first read data DATA_IN<0> as the first selection signal DATA_IN<0>_S.

The data selection unit 252C may select the first delay data DATA_IN<0>_D or the inverted first latch data DATA_IN<0>_L_INV compensate for the amount of the DBI decision time as the DBI mode signal DBI_ENABLE is activated.

The data arrangement unit 254 may arrange the first selection signal DATA_IN<0>_S output from the data selection unit 252 in response to the third arrangement control signal PIPE_IN and output the arranged first selection signal DATA_IN<0>_S as the first output data DQ0_DOUT<0> to the external in response to the output control signal PIPE_OUT.

Meanwhile, the semiconductor device 200 may exit from the DBI operation mode as the DBI mode signal DBI_ENABLE is deactivated.

Here, the semiconductor device 200 may perform read operation in response to the commands CS, RAS, and CAS and the clocks CK and CKB.

During the read operation, the command control unit 210 may generate the first arrangement control signal PIPE_IN_PRE and the output control signal PIPE_OUT in response to the commands CS, RAS, and CAS and the clocks CK and CKB.

The command selection unit 224 may select and output the first arrangement control signal PIPE_IN_PRE of the first arrangement control signal PIPE_IN_PRE and the second arrangement control signal PIPE_IN_D as the third arrangement control signal PIPE_IN to the data arrangement unit 254 in response to the DBI mode signal DBI_ENABLE.

The DBI replica delay unit 222 may be disabled.

During the read operation, the first to 64th read data DATA_IN<0:63> are output from the cell array (not illustrated).

The data selection unit 252 may select the first read data DATA_IN<0> among the first read data DATA_IN<0>, the first delay data DATA_IN<0>_D, and the inverted first latch data DATA_IN<0>_L_INV, and output the first read data DATA_IN<0> as the first selection signal DATA_IN<0>_S to the data arrangement unit 254.

The data synchronization unit 240 may be disabled in response to the DBI mode signal DBI_ENABLE.

In the data selection unit 252, the second selection control signal DBI_FLIP_D<0> and the third selection control signal DBI_PASS_D<0> may be deactivated according to deactivation of the DBI mode signal DBI_ENABLE. Accordingly, the first read data DATA_IN<0> may be output as the first selection signal DATA_IN<0>_S in response to the first selection control signal DBI_OFF.

The data arrangement unit 254 may arrange the first selection signal DATA_IN<0>_S output from the data selection unit 252 in response to the third arrangement control signal PIPE_IN and output the arranged first selection signal DATA_IN<0>_S as the first output data DQ0_DOUT<0> to the external in response to the output control signal PIPE_OUT.

In accordance with the embodiments of the present invention, the circuit area for supporting the DBI operation mode may be minimized and the current consumption for supporting the DBI operation mode may also be minimized in comparison with the comparative example.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a data bus inversion (DBI) decision unit suitable for deciding whether a DBI operation mode is performed, based on a read data, and generating a DBI decision signal corresponding to a result of the decision;
an output control unit suitable for generating an arrangement control signal in which a delay amount of time for the decision is reflected, during a DBI operation mode;
a data synchronization unit suitable for synchronizing the read data with the arrangement control signal and output the synchronized read data and inverted signals of the synchronized read data, during the DBI operation mode; and
a data output unit suitable for receiving the synchronized read data, the inverted signals of the synchronized read data, the arrangement control signal and an output control signal, and selectively outputting the synchronized read data and the inverted signals of the synchronized read data, to an external in response to the DBI decision signal, the arrangement control signal and the output control signal, during the DBI operation mode.

2. The semiconductor device of claim 1, wherein the data synchronization unit includes:
an input unit suitable for receiving the read data; and
a data latch unit suitable for synchronizing the read data with the arrangement control signal and outputting the synchronized read data and the inverted signals of the synchronized read data, in the DBI operation mode.

3. The semiconductor device of claim 1, further comprising a command control unit suitable for generating a pre-arrangement control signal and the output control signal based on a read command and a clock.

4. The semiconductor device of claim 3, wherein the data latch unit includes:
a DBI replica delay unit suitable for generating the arrangement control signal by delaying the pre-arrangement control signal by the delay amount of time for the decision, in the DBI operation mode.

5. The semiconductor device of claim 2, wherein the data latch unit includes:
a transmission gate suitable for transferring the read data in response to the arrangement control signal; and
an inverter latch suitable for latching the transferred read data, and outputting the latched read data as the synchronized read data.

6. A semiconductor device comprising:
a command control unit suitable for generating a first arrangement control signal and an output control signal based on a read command;
a data bus inversion (DBI) decision unit suitable for determining whether a DBI operation mode is performed, based on a first read data and generating a DBI decision signal corresponding to a result of the decision;
a DBI replica delay unit suitable for generating a second arrangement control signal by delaying the first arrangement control signal by an amount of time for the decision;
a command selection unit suitable for selecting one of the first arrangement control signal and the second arrangement control signal in response to a DBI mode signal, and outputting the selected one as a third arrangement control signal;
a data synchronization unit suitable for synchronizing the first read data with the second arrangement control signal and outputting the synchronized data as a second read data and an inverted second read data in response to the DBI mode signal;
a data selection unit suitable for selectively outputting one of the first read data, the second read data, and the inverted second read data in response to the DBI decision signal and the DBI mode signal; and
a data arrangement unit suitable for arranging the selected read data output from the data selection unit in response to the third arrangement control signal, and outputting the arranged read data to an external in response to the output control signal.

7. The semiconductor device of claim 6, wherein the data synchronization unit includes:
an input unit suitable for selectively transferring the first read data in response to the DBI mode signal; and
a data latch unit suitable for latching an output signal of the input unit in response to the second arrangement control signal, and outputting the latched signal as the second read data and the inverted second read data.

8. The semiconductor device of claim 7, wherein the data latch unit includes:
a transmission gate suitable for transferring the output signal of the input unit in response to the arrangement control signal; and
an inverter latch suitable for latching the transferred signal, and outputting the latched signal as the second read data.

9. The semiconductor device of claim 6, wherein the data selection unit includes:
a selection control unit suitable for generating a first output selection signal in response to the DBI mode signal, and a second and third output selection signal, which are selectively activated when the DBI mode signal is activated, in response to the DBI mode signal and the DBI decision signal; and
a selection unit suitable for outputting one of the first read data, the second read data, and the inverted second data as the selected read data in response to the first to third output selection signal.

10. The semiconductor device of claim 6, wherein the data arrangement unit includes a pipe register.

11. A semiconductor device comprising:
a data bus inversion (DBI) decision unit suitable for determining whether or not to inverse bits of a data to be transmitted, based on a plurality of first data;
an output control unit suitable for outputting one of a first arrangement control signal and a second arrangement control signal, which is generated by delaying the first arrangement control signal with the amount of time for deciding whether or not to inverse bits of the data to be transmitted, as a third arrangement control signal in response to a DBI mode signal;
a data synchronization unit suitable for synchronizing the plurality of first data with a second arrangement control signal and output the synchronized data in response to the DBI mode signal;
a data selection unit suitable for outputting one of the plurality of first data, a plurality of second data output from the data synchronization unit and a plurality of third data inverted from the plurality of second data in response to a DBI decision signal output from the DBI decision unit; and
a data arrangement unit suitable for arranging a plurality of fourth data output from the data selection unit in response to the third arrangement control signal and outputting the arranged plurality of fourth data to an external in response to an output control signal.

12. The semiconductor device of claim 10, wherein the output control unit includes:
a DBI replica delay unit suitable for generating the second arrangement control signal in response to the first arrangement control signal; and a command selection unit suitable for selecting one of the first arrangement control signal and the second arrangement control signal in response to the DBI mode signal.

\* \* \* \* \*